(12) United States Patent
Lee

(10) Patent No.: US 8,471,295 B2
(45) Date of Patent: Jun. 25, 2013

(54) HIGH DENSITY FLASH MEMORY DEVICE, CELL STRING AND FABRICATING METHOD THEREOF

(75) Inventor: Jong-Ho Lee, Seoul (KR)

(73) Assignee: SNU R&DB Foundation (KR)

( * ) Notice: Subject to any disclaimer, the term of this patent is extended or adjusted under 35 U.S.C. 154(b) by 414 days.

(21) Appl. No.: 12/312,985

(22) PCT Filed: Dec. 4, 2007

(86) PCT No.: PCT/KR2007/006230
§ 371 (c)(1),
(2), (4) Date: Jun. 3, 2009

(87) PCT Pub. No.: WO2008/069539
PCT Pub. Date: Jun. 12, 2008

(65) Prior Publication Data
US 2010/0038698 A1   Feb. 18, 2010

(30) Foreign Application Priority Data

Dec. 4, 2006  (KR) .................. 10-2006-0121143

(51) Int. Cl.
*H01L 27/118* (2006.01)
(52) U.S. Cl.
USPC ........... 257/204; 257/205; 257/321; 257/324; 257/326; 257/E27.103
(58) Field of Classification Search
USPC ........... 257/321, 324, 326, 204, 205, E27.103
See application file for complete search history.

(56) References Cited

U.S. PATENT DOCUMENTS 5,691,552 A * 11/1997 Oyama ................... 257/316
5,862,082 A *  1/1999 Dejenfelt et al. ........ 365/185.33
(Continued)

FOREIGN PATENT DOCUMENTS

KR   10-2004-0063350   7/2004
KR   10-2006-0084105   7/2006

OTHER PUBLICATIONS

Sang-Phil Sim, et al., "Fully 3-Dimensional NOR Flash Cell with Recessed Channel and Cylindrical Floating Gate—A Scaling Direction for 65nm and Beyond," 2006 Symposium on VLSI Technology Digest of Technical Papers, 2006.

(Continued)

*Primary Examiner* — Robert Huber
(74) *Attorney, Agent, or Firm* — Cantor Colburn LLP

(57) ABSTRACT

A flash memory cell string and a method of fabricating the same are provided. The flash memory cell string includes a plurality of cell devices and switching devices connected to ends of the cell devices. Each of the cell devices includes a semiconductor substrate, a tunneling insulating layer, a charge storage node, a control insulating layer, and a control electrode which are sequentially laminated on the semiconductor substrate. In each cell device, a source/drain region is not formed. The switching device does not include a source or drain region in a side connected to the cell devices. The switching device includes a source or drain region in the other side that is not connected to the cell devices. The source or drain region does or does not overlap the control electrode. Accordingly, it is possible to improve a miniaturization property and performance of NAND flash memory cell devices. If necessary, it is possible to electrically connect cells or cell strings by inducing an inversion layer through a fringing electric field from a control electrode.

10 Claims, 13 Drawing Sheets

U.S. PATENT DOCUMENTS

| | | | | |
|---|---|---|---|---|
| 7,115,949 | B2 * | 10/2006 | Hoefler et al. | 257/350 |
| 7,416,940 | B1 * | 8/2008 | Torii et al. | 438/257 |
| 2005/0112854 | A1 * | 5/2005 | Ito et al. | 438/527 |
| 2006/0261401 | A1 * | 11/2006 | Bhattacharyya | 257/316 |

OTHER PUBLICATIONS

Ki-Tae Park, et al., "A 64-Cell NAND Flash Memory with Asymmetric S/D Structure for Sub-40nm Technology and Beyond," 2006 Symposium on VLSI Technology Digest of Technical Papers, 2006.

* cited by examiner

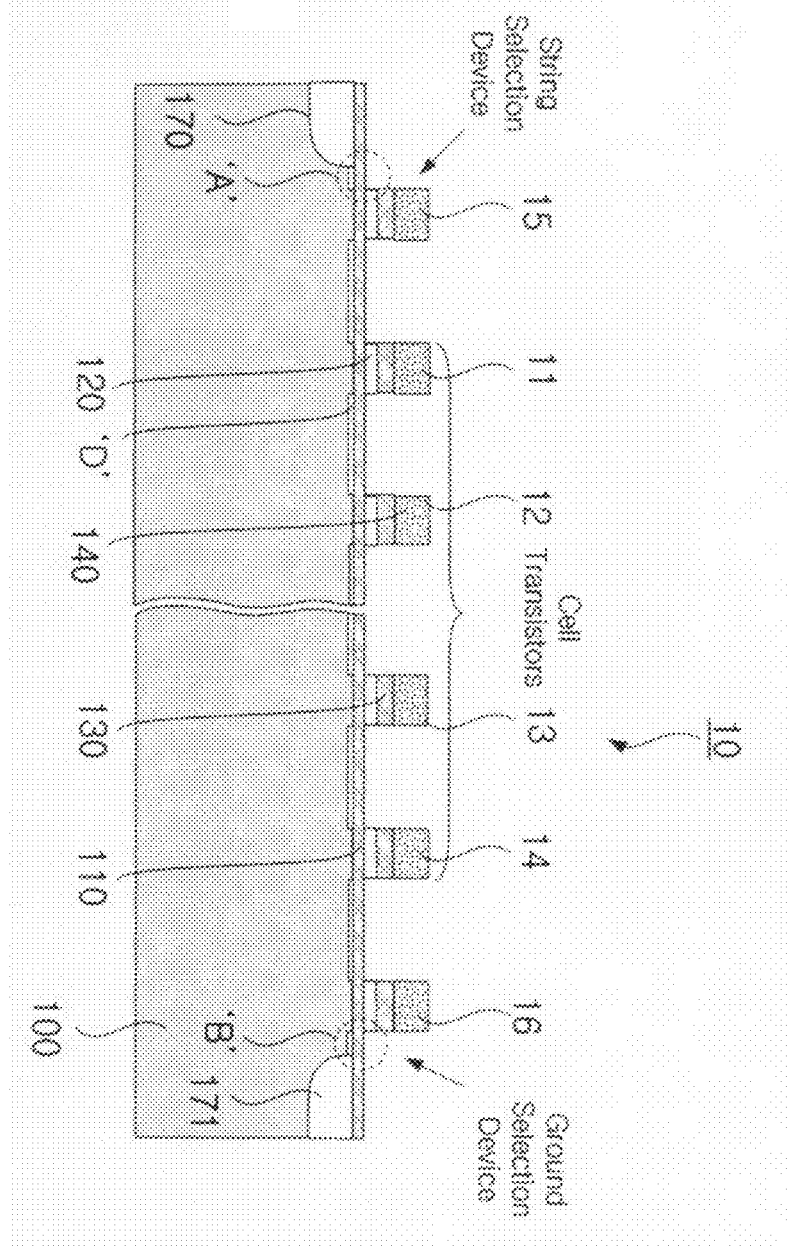

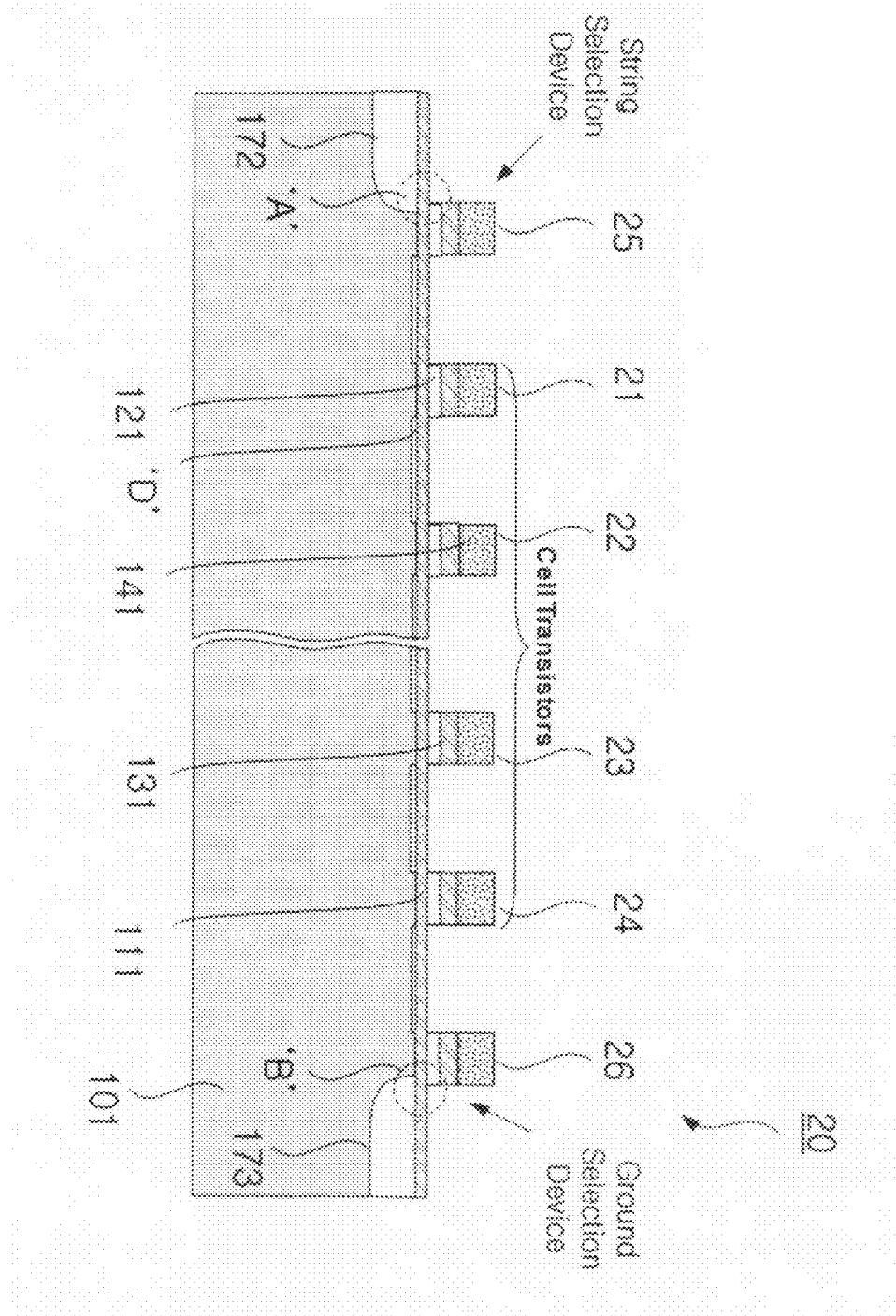

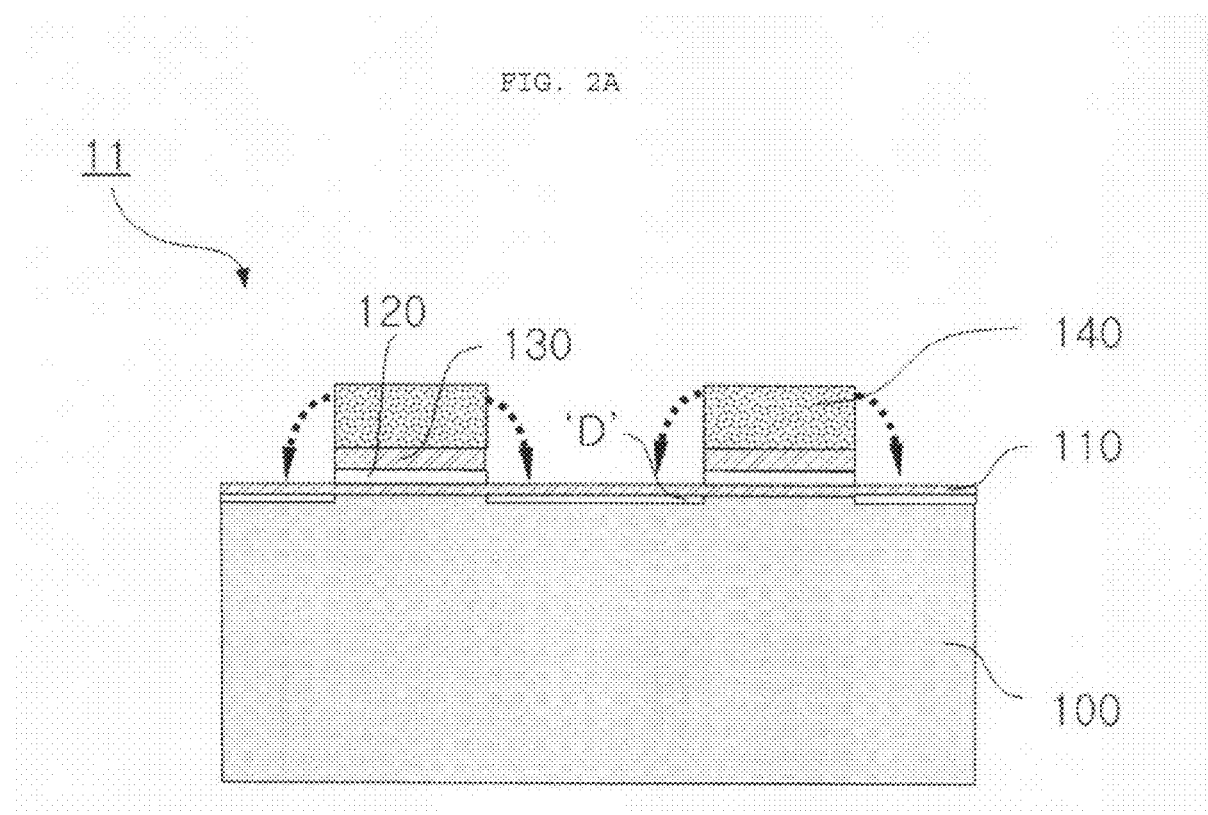

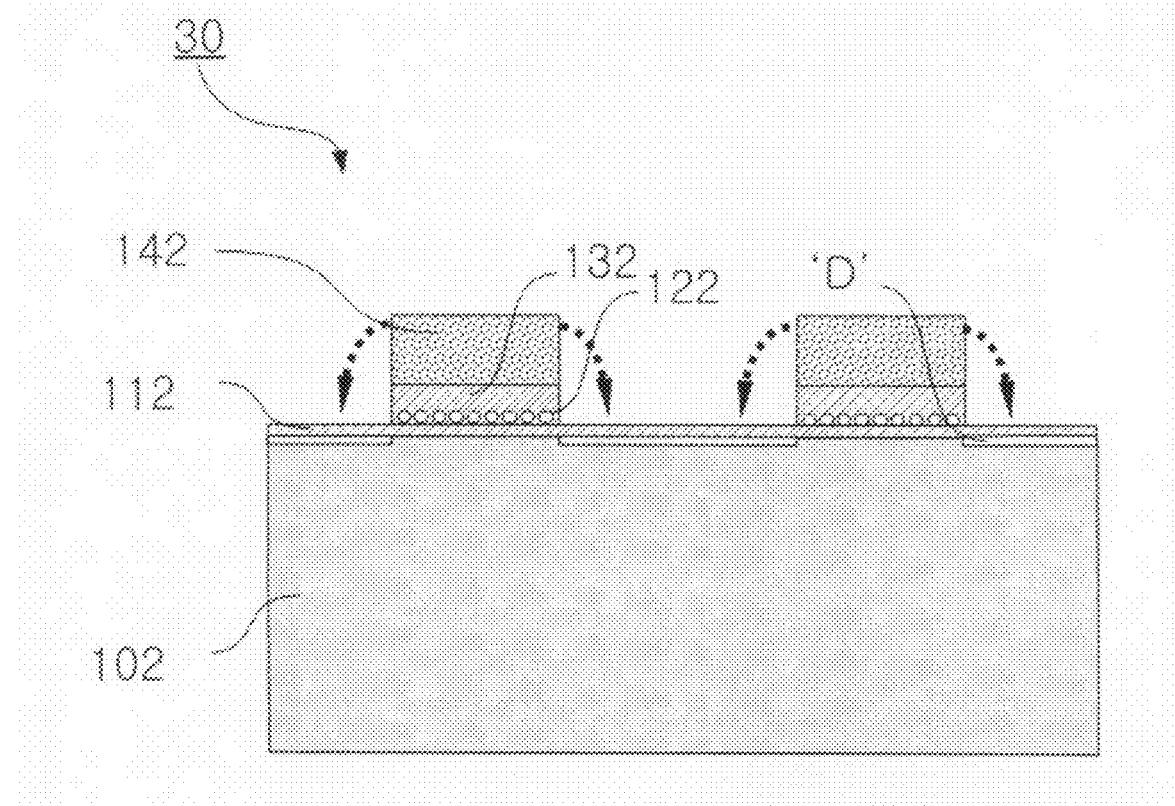

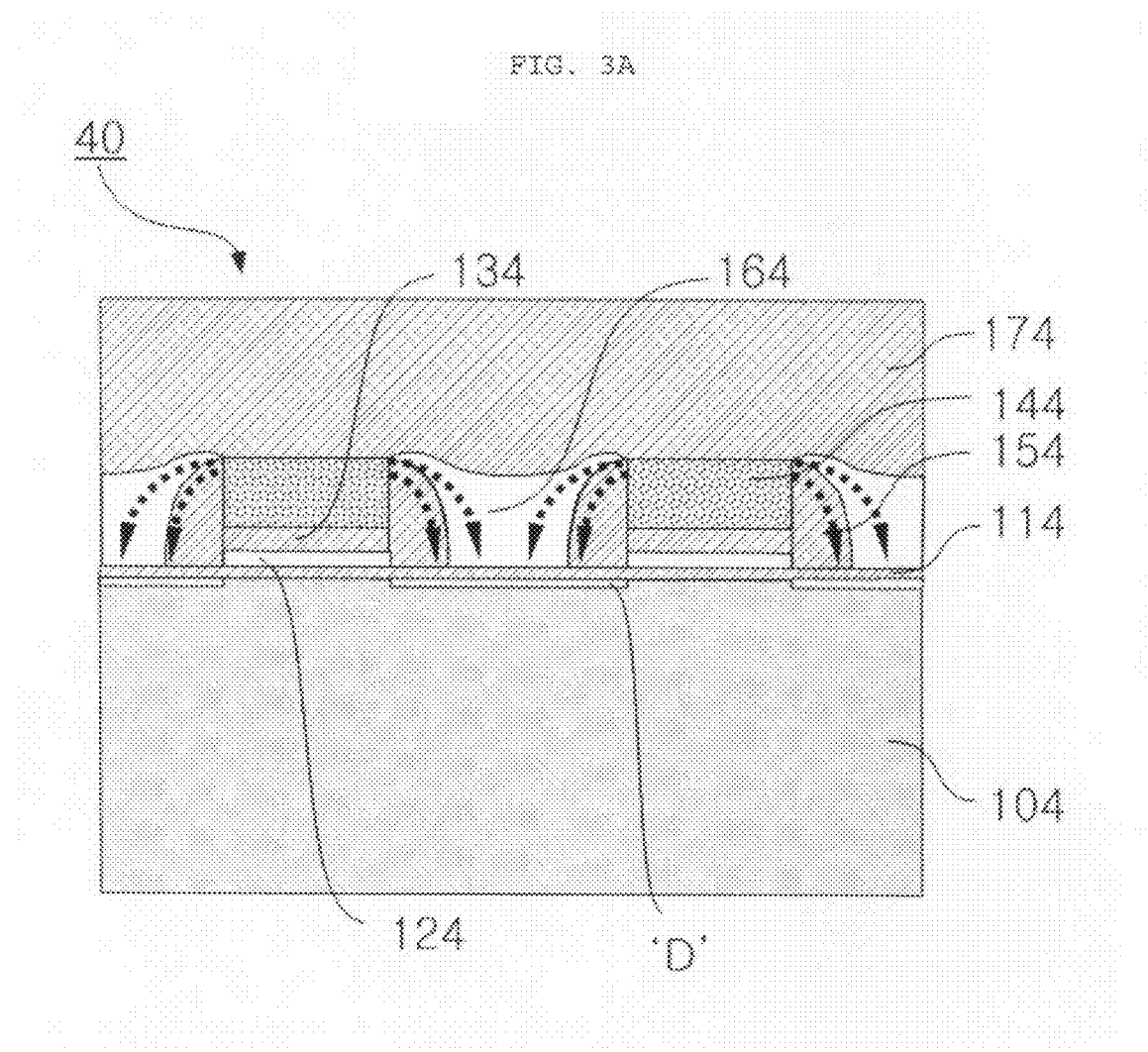

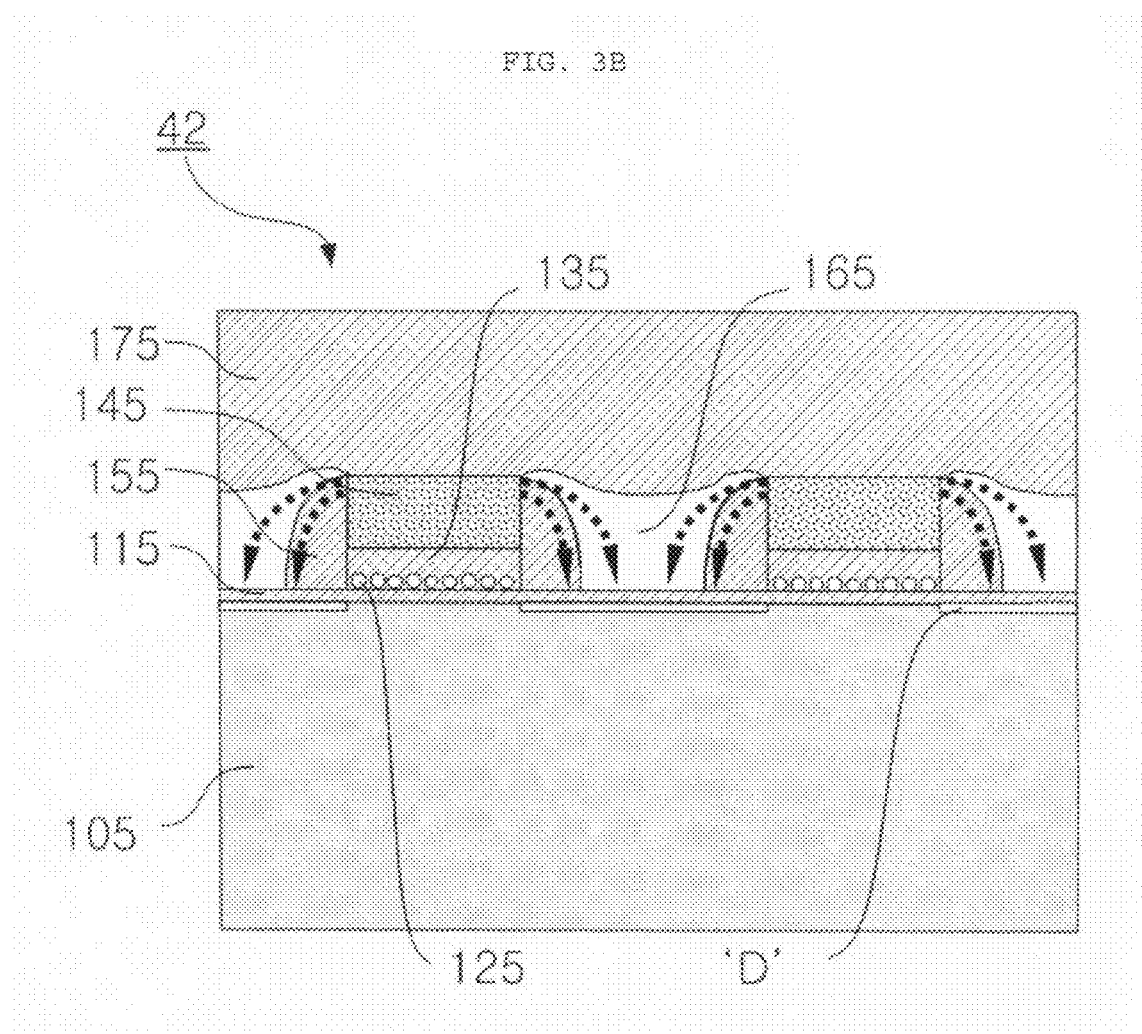

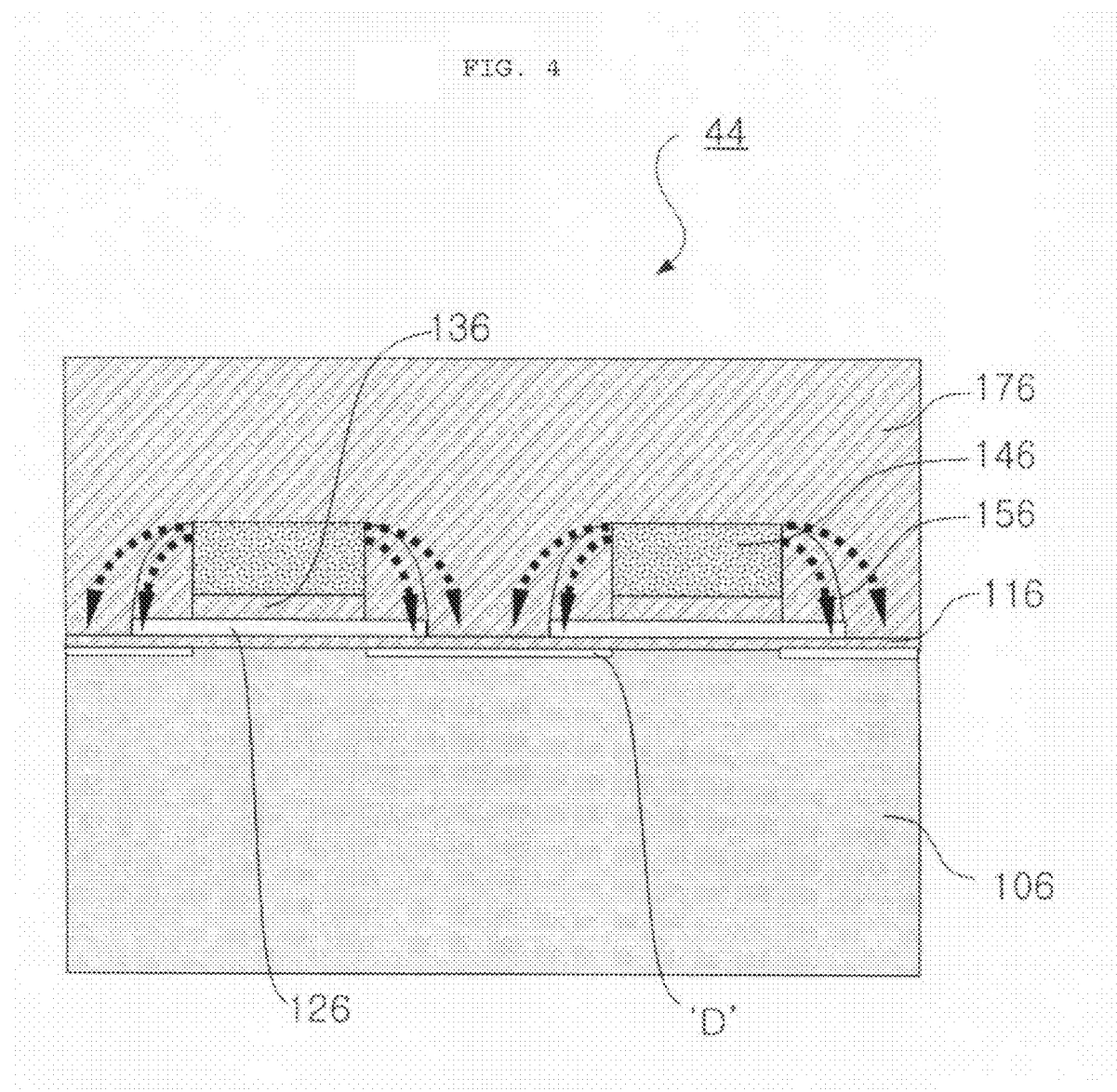

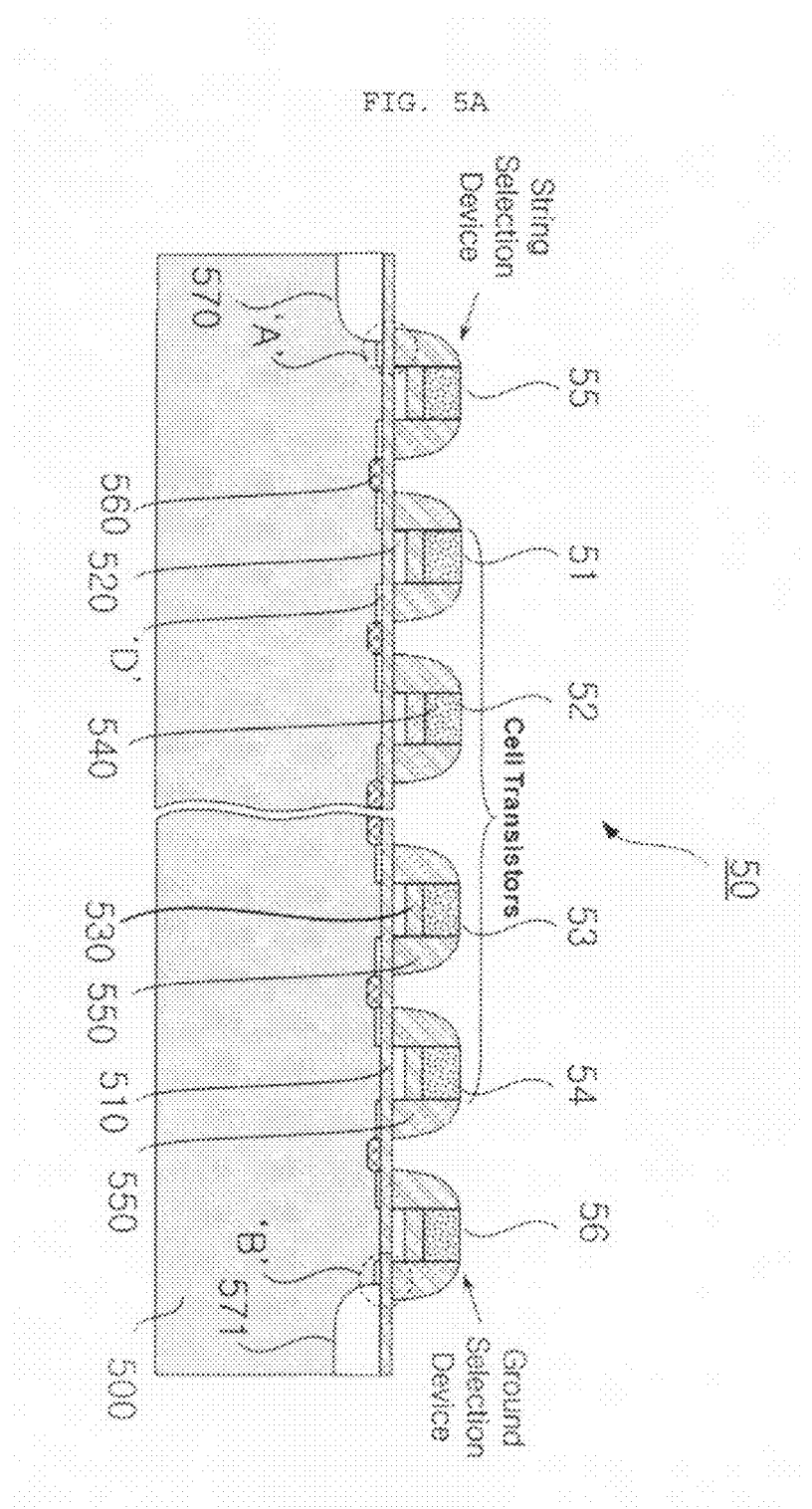

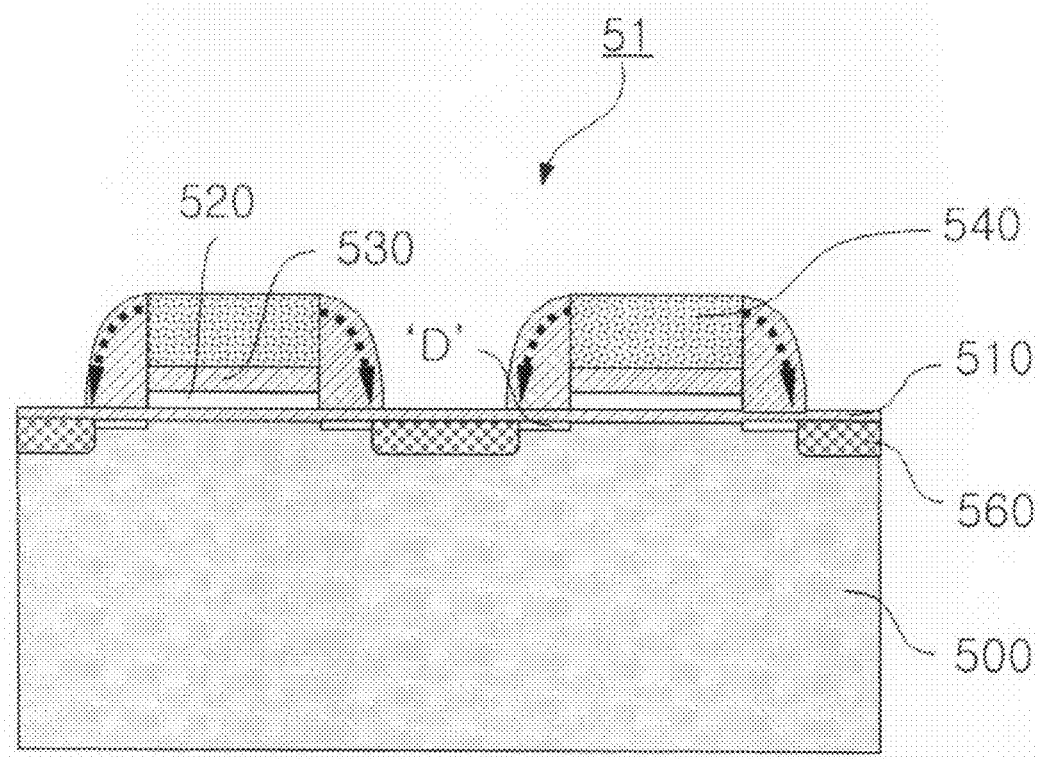

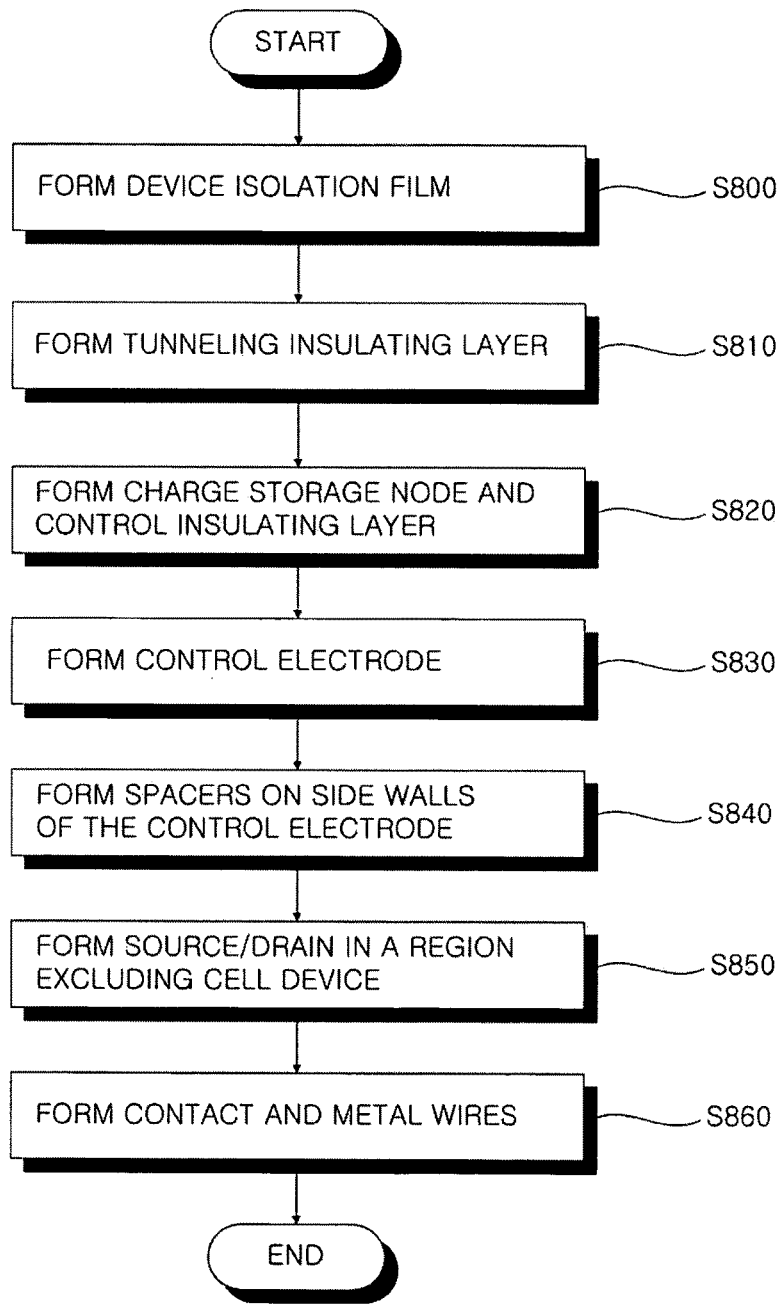

HIGH DENSITY FLASH MEMORY DEVICE, CELL STRING AND FABRICATING METHOD THEREOF

This is a National Phase Application of PCT/KR2007/006230 filed Dec. 4, 2007 claiming priority from KR Application No. 10-2006-0121143, dated Dec. 4, 2006, the entire content of which is hereby incorporated by reference in its entirety.

TECHNICAL FIELD

The present invention relates to a NAND flash memory cell device, a cell string, and a method of fabricating the same, and more particularly, to a structure of a new NAND flash memory cell device capable of miniaturizing a MOS-based flash memory device, improving performance of the MOS-based flash memory device, and increasing memory capacity and a cell string.

BACKGROUND ART

Recently, since demands on a flash memory greatly increase in consumer electronics and mobile electric devices, a market of the flash memory is expected to exceed a market of an existing DRAM in 2007. Therefore, a memory device with a high integration degree and a short write/erase time has been required.

The integration degree of a NAND flash memory has been required to increase, as IT techniques are developed. The integration degree of the NAND flash greatly depends on an integration degree of cell devices. Recently, a length of the cell device decreases below 50 nm, and a total capacity of the memory reaches tens of gigabits. Accordingly, a short channel effect becomes a big problem in the NAND flash device having a planar channel structure including an existing conductive floating gate, and thus, there is a limitation to reduce the gate length. In addition, demands on a multi-level cell have been increased. Since the short channel effect due to device miniaturization increases dispersion of a threshold voltage in the multi-level cell, there is a limitation or impossibility to use the multi-level cell. In order to improve the integration degree of the NAND flash memory, the gate length needs to be reduced. Therefore, in order to solve the problem, other alternative techniques have to be considered. In order to increase an integration degree of a device having an existing floating poly-electrode, an SONOS flash memory cell that uses an insulating storage electrode such as a nitride layer as a memory storage node is considered. In addition, a nano-floating gate memory (NFGM) that uses nano-sized dots (or nano-sized crystals) as a storage electrode is considered. In a case where a memory cell is embodied by forming a storage electrode such as nano-sized dots or a nitride layer on an existing planar channel structure, miniaturization characteristics can be improved in comparison with a case where an existing conductive poly-silicon floating gate is used. However, although the improved storage electrode is used, in a case where the gate length is equal to or less than 40 nm, it is difficult or impossible to miniaturize a memory cell due to a short channel effect.

In order to suppress the short channel effect caused in a case where a gate length of a cell device decreases below 40 nm and reduce a dispersion of a threshold voltage, an SONOS (or TANOS: TaN—AlO—SiN-Oxide-Si) cell device having an asymmetric source/drain structure on a planar channel device is proposed by Samsung Electronics Co., Ltd. (K. T. Park et al, A 64-cell NAND flash memory with asymmetric S/D structure for sub-40 nm technology and beyond, in Technical Digest of Symposium on VLSI Technology, p. 24, 2006). In the aforementioned structure, with respect to a gate of a cell device, there is a region corresponding to a source or drain in the one side of the cell device, and there is no source or drain in the other side thereof. In the structure, the short channel effect is suppressed by forming an inversion layer using a fringing electric field from a control electrode in a region where there is no source or drain. Although in the aforementioned structure, a miniaturization characteristic is improved in comparison with an SONOS cell device having a planar channel and an existing source/drain region, the source or drain of the cell device overlaps the control electrode. Accordingly, the short channel effect occurs in a channel length equal to or less than 40 nm. As a result, there is a limitation to miniaturize a cell device having a planar channel structure.

In addition, a flash device structure in which a channel is recessed and a conductive floating gate is used as a storage electrode so as to reduce the short channel effect occurring in the existing planar channel structure is proposed by Samsung Electronics Co., Ltd. (S.-P. Sim et al, Full 3-dimensional NOR flash cell with recessed channel and cylindrical floating gate—A scaling direction for 65 nm and beyond, in Technical Digest of Symposium on VLSI Technology, p. 22, 2006). However, as the device is miniaturized, the width of a recessed region needs to be reduced. Accordingly, characteristics of the device deteriorate, and non-uniformity of the device increase.

Accordingly, a high integration/performance flash memory device capable of suppressing a short channel effect due to miniaturization of the device and deterioration of performance of the device is required to be developed.

DISCLOSURE

Technical Problem

In order to solve the aforementioned problems, present invention provides a flash memory cell string with a high miniaturization property, the flash memory cell string capable of reducing dispersion of a threshold voltage and a method of fabricating the same.

Technical Solution

According to an aspect of the present invention, there is provided a flash memory cell string constructed with sequentially connected cell devices and at least one switching device for selecting a cell string and located at an end of the connected cell devices, wherein each of the cell devices includes a semiconductor substrate, a tunneling insulating layer formed on the semiconductor substrate, and a charge storage node, a control insulating layer, and a control electrode which are sequentially formed on the tunneling insulating layer, and wherein the cell devices do not include a source or drain region.

In the above aspect of the present invention, the switching device does not include a source or drain region in a side connected to an adjacent cell device, and in the switching device, a source or drain region in the other side that is not connected to any cell device does not overlap the control electrode.

In addition, the switching device does not include a source or drain region in a side connected to an adjacent cell device and includes a source or drain region in the other side that is not connected to the cell devices, and the source or drain region overlaps the control electrode of the switching device.

In addition, in the aforementioned flash memory cell string, insulating spacers may be formed on side walls the control electrode of the switching device and the cell devices, or insulating spacers may be formed on the side walls the control electrode of the switching device and the cell devices, and an insulating layer having a large dielectric constant may be formed between adjacent insulating spacers.

According to another aspect of the present invention, there is provided a flash memory cell string including cell devices and switching devices, wherein each of the cell devices includes a semiconductor substrate, a tunneling insulating layer formed on the semiconductor substrate, a charge storage node and a control insulating layer which are sequentially formed on the tunneling insulating layer, a control electrode formed on the control insulating layer, and source and drain regions which do not overlap the control electrode, and wherein the switching device is formed so that the source or drain region in a side connected to the cell devices does not overlap the control electrode of the swithing device and so that the source or drain region in a side that is not connected to the cell devices overlaps the control electrode of the switching device.

In the above aspect of the present invention, the charge storage node of each of the cell devices of the flash memory cell string may be constructed with a thin film made of an insulation material, constructed with nano-sized dots or nano-sized crystal, or constructed by combining an insulation thin film with nano-sized dots.

According to another aspect of the present invention, there is provided a method of fabricating a flash memory cell, the method comprising: (a) forming a device isolation region on a semiconductor substrate; (b) forming a tunneling insulating layer on the resulting product;
(c) forming a charge storage node on the resulting product;
(d) forming a control insulating layer on the resulting product and forming a control electrode; (e) forming a source/drain region in a region excluding a cell device region; (f) forming an interlayer insulating layer on the resulting product; and (g) sequentailly forming a contact in a portion where the contact is needed in a region excluding a cell device and forming a metal layer.

Advantageous Effects

As described above, in a NAND flash memory, a NAND flash memory cell constituting a cell string includes no source/drain region or has a structure of a planar channel in which a source/drain region does not overlap a control electrode so as to miniaturize the NAND flash memory by suppressing a short channel effect with respect to a gate length equal to or greater than 40 nm in comparison with a cell having a planar channel structure including an existing source/drain. There are additional advantages to be described later.

First, it is possible to increase an integration degree by preventing a source or drain from overlapping a control electrode (or gate electrode) in a device for selecting a cell string in addition to cell devices. That is, an integration degree of a cell string is improved.

Second, in the present invention, since a cell device of a cell string includes no source/drain or has a structure in which a source/drain does not overlap a control electrode, a gate induced drain leakage (GIDL) is relatively small. Accordingly, it is possible to reduce a current in an off-state. In a case where there is no source/drain, a leak current in a junction between the source/drain and a substrate is not generated. Although the source/drain does not overlap the control electrode, a width is small. Accordingly, a leak current due to a junction is reduced.

DESCRIPTION OF DRAWINGS

FIG. 1 includes cross-sectional views illustrating a flash memory cell string according to an exemplary embodiment of the present invention. In (a) of FIG. 1, a source/drain does not overlap a control electrode in a switching device located at an edge of the cell string. In (b) of FIG. 1, a source/drain overlaps a control electrode in a switching device at an edge of the cell string.

FIG. 2 include cross-sectional views illustrating two of the cell devices of the cell string of (a) of FIG. 1. In FIG. 2, (a) is a cross-sectional view illustrating cell devices of a flash memory cell string that employs a nitride layer as a charge-storage electrode. In FIG. 2, (b) is a cross-sectional view illustrating cell devices of a flash memory cell string that employs a nano dot or nano crystal as a charge storage electrode.

FIGS. 3 (a) and (b) are cross-sectional views illustrating a structure in which an inversion layer is easily formed by a fringing electric field generated from a side of a control electrode in a region in which a source/drain is not formed by using an insulating layer spacer and an insulation material, which have different dielectric constants in a cell device structure in which a nitride layer is used as a charge storage node and in a cell device structure in which nano dots are used as a charge storage node.

FIG. 4 is a cross-sectional view illustrating cell devices of a flash memory cell string according to another exemplary embodiment of the present invention. In FIG. 4, a length of a charge-storage electrode is greater than that of a control electrode. FIG. 4 is a cross-sectional view illustrating a structure in which insulating layer spacers and an insulation layer for insulating a control electrode from metal wires are formed.

In FIG. 5, (a) illustrates a cell string including cell devices having a planar channel structure in which a source/drain does not overlap a control electrode. A source/drain region of a switching device does not overlap a control electrode. In FIG. 5, (b) is a cross-sectional view illustrating a cell string in which a source/drain region of a switching device located at an edge of the cell string overlaps a control electrode.

In FIG. 6, (a) is a cross-sectional view illustrating cell devices of a flash memory cell string that employs a nitride layer as a charge-storage electrode. In FIG. 6, (b) is a cross-sectional view illustrating cell devices of a flash memory cell string that employs a nano dot or nano crystal as a charge-storage electrode.

In FIG. 7, a length of a charge-storage electrode is greater than that of a control electrode. FIG. 7 is a cross-sectional view illustrating a structure in which insulating layer spacers and an insulation layer for insulating a control electrode from metal wires are formed.

FIG. 8 is a flowchart of a method of fabricating a flash memory cell string according to an exemplary embodiment of the present invention.

BEST MODE

Figure 5B:
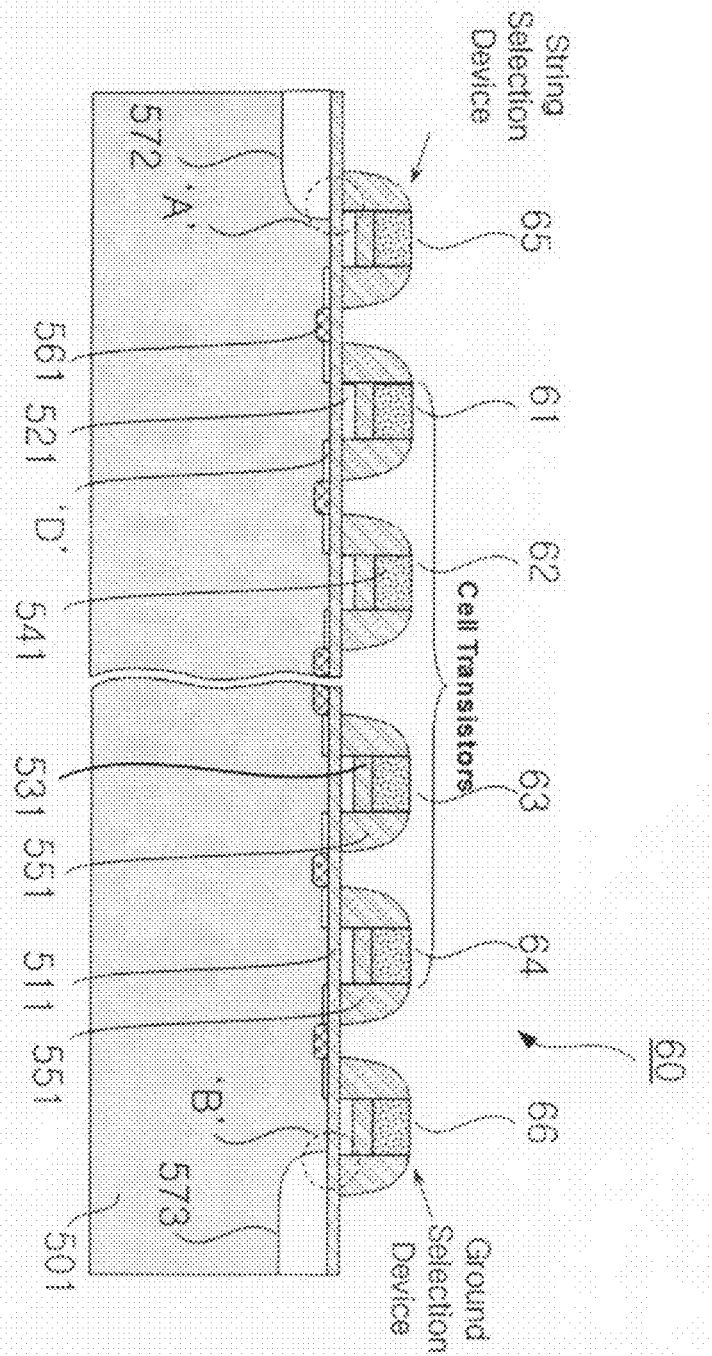
FIG. 5 includes cross-sectional views illustrating a flash memory cell string according to another embodiment of the present invention.

Hereinafter, a structure and operations of a NAND flash memory cell string according to exemplary embodiments of the present invention will be described in detail with reference to accompanying drawings.

In FIG. 1, (a) is a cross-sectional view illustrating a flash memory cell string according to an exemplary embodiment of the present invention. Referring to (a) of FIG. 1, a flash memory cell string 10 according to the exemplary embodiment of the present invention includes a plurality of cell devices 11 to 14 and first and second switching devices 15 and 16. A source or drain of the first and second switching devices which are formed at both edges of the cell string 10 does not overlap a control electrode. The cell device of (a) in FIG. 1 is applied to (b) of FIG. 1, except that a source or drain of first and second switching devices which are formed at both edges of the cell string overlaps a control electrode of the switching device.

FIG. 2 is an enlarged cross-sectional view illustrating cell devices of (a) of FIG. 1. Referring to (a) of FIGS. 2 and (a) of FIG. 1, the cell device 11 is obtained by sequentially forming a semiconductor substrate 100, a tunneling insulating layer 110, a charge storage node 120, a control insulating layer 130, and a control electrode 140. Specifically, the cell device 11 according to the embodiment of the present invention does not include a source/drain region. Accordingly, an inversion layer (D region) is formed by using a fringing electric field generated from a control electrode 140, so that the cell devices according to the embodiment of the present invention operate as a NAND flash memory. In FIG. 1, D indicates a region in which an inversion layer is induced. That is, if necessary for operations of a NAND flash, the inversion layer D is formed by the fringing electric field generated from the control electrode 140, thereby enabling cell devices to operate.

A dotted line arrow indicates the fringing electric field generated from the side of the control electrode 140. In FIG. 2, (a) is a cross-sectional view illustrating an example in which the charge-storage node 120 is formed as a nitride layer. In FIG. 2, (b) is a cross-sectional view illustrating an example in which the charge-storage node 122 of a cell device 30 is formed as nano-sized dots or nano-sized crystals.

The first and second switching devices 15 and 16 are used to select a cell string and located at both ends of the connected cell devices. Referring to (a) of FIG. 1, the first switching device 15 is obtained by sequentially forming the semiconductor substrate 100, the tunneling insulating layer 110, the charge-storage node 120, the control insulating layer 130, and the control electrode 140. A source or drain region 170 is formed in a side (A of FIG. 1) in which the first switching device is not connected to a cell device. The source or drain region 170 does not overlap the control electrode of the switching device 15.

On the other hand, the second switching device 16 has the same structure as the first switching device except that a source or drain region 171 is formed in a side (B of FIG. 1) in which the second switching device is not connected to a cell device. In this case, in a case where the drain region 170 is formed in a side in which the first switching device 15 is not connected to a cell device, the source region 171 is formed in a side in which the second switching device 16 is not connected to a cell device.

Hereinafter, a NAND flash memory cell string according to another embodiment of the present invention will be described with reference to (b) of FIG. 1. A memory cell string 20 according to the embodiment includes a plurality of cell devices 21 to 24 and first and second switching devices 25 and 26. Since the cell devices have the same structure as those of (a) of FIG. 1, the description on the cell devices will be omitted. The first and second switching devices have a structure similar to the cell devices shown in (b) of FIG. 1 except that source or drain region of the first and second switching devices according to the embodiment overlaps a control electrode.

Like cell devices under the control electrode 140, a switching device of the NAND flash memory cell string device according to the embodiment includes a tunneling insulating layer 110, a charge storage node 120, and a control insulating layer 130. Alternatively, the switching device of the NAND flash memory cell string device may be constructed with one or more insulating layers without a charge storage node.

Hereinafter, cell devices according to another embodiment of the present invention will be described. In FIG. 3, (a) is an enlarged cross-sectional view illustrating cell devices 40 of a cell string according to the embodiment of the present invention.

Referring to (a) of FIG. 3, the cell devices 40 are constructed by forming a control electrode 144, forming spacers 154 on side walls of the control electrode 144, forming a first insulating layer 164 having a large dielectric constant between adjacent cell devices, and forming a second insulating layer 174 on the result structure. A contact region is not formed on the cell devices. In this case, the dielectric constant of the spacers 154 and the dielectric constant of the first insulating layer 164 are adjustable. An inversion layer D caused by a fringing electric field is more easily induced by adjusting the dielectric constants. Here, the charge storage node 124 is formed as an insulation thin film such as a nitride layer.

In FIG. 3, (b) is a cross-sectional view illustrating the cell devices according to another embodiment of the present invention. Referring to (b) of FIG. 3, the charge storage node 125 of the cell device 42 according to the embodiment is constructed with nano-sized dots.

FIG. 4 is a cross-sectional view illustrating cell devices according to another embodiment of the present invention. Referring to FIG. 4, cell devices 44 according to the embodiment includes a charge storage node 126 of which length is greater than that of a control electrode 146. In some cases, the length of the charge storage node 126 may be less than that of the control electrode 146 by etching a side of the charge storage node 126.

Hereinafter, a switching device of a cell string according to an exemplary embodiment will be described in detail. It is possible to reduce contact resistance of the switching device by adding a highly-doped source or drain region to the source or drain region. In addition, in the cell string, the length of the control electrode may be similar to or different from a spacing between adjacent control electrodes based on procedures of fabricating the cell string.

Hereinafter, a structure of a cell string will be described with reference to (a) of FIG. 1.

In a cell device, a control electrode is formed. In a switching device for selecting a cell string, a source or drain in a side that is not connected to the cell devices does or does not overlap a control electrode (or gate electrode) of the switching device. A NAND flash cell string is constructed with cell devices not including a source/drain and switching devices including a source or drain in only one side.

The tunneling insulating layer 110 has a thickness of 1 nm to 10 nm. The tunneling insulating layer 110 may be constructed with a single layer or multi-layers. The tunneling insulating layer may be made of materials having various dielectric constants. For example, the materials include a semiconductor oxide, a semiconductor nitride ($Si_3N_4$, etc), and a metal oxide. In addition, the tunneling insulating layer may be constructed with multi-layers of which dielectric constants or band-gaps are different.

The charge storage node 120 indicates a region capable of storing charges in the cell string according to the embodiment. The thickness of the charge storage node 120 is in a range of 0.5 nm to 0.8 nm. The charge storage node may be constructed with a thin film, nano-sized dots or nano-sized crystals. Alternatively, the change storage node may be constructed by combining an insulation thin film with nano-sized dots. The charge storage node that is a thin film is made of an insulation material including a nitride layer and a metal oxide which is capable of storing charges. When nano-sized dots are used as charge storage nodes, the charge storage nodes are made of a semiconductor (silicon (Si), germanium (Ge), etc), various metal oxides (for example hafnium oxide ($Hf_2O$), etc), a metal (for example, tungsten (W), etc), a metal nitride (for example, tungsten nitride (WN), titanium nitride (TiN), tantalum nitride (TaN), etc), silicide (for example, titanium silicide ($TiSi_2$), cobalt silicide ($CoSi_2$), etc), and the like. In addition, the insulating layer for storing charges may be made of a material including a metal or semiconductor constructed with nano-sized particles. For example, it is possible to form nano-sized Si-dots by using an excess of silicon in silicon dioxide ($SiO_2$) or silicon nitride ($Si_3N_4$) or to form nano-sized Ge-dots by injecting germanium (Ge).

The control insulating layer 130 serves to electrically separate the charge storage node from the control electrode. The thickness of the control insulating layer 130 is in a range of 2 nm to 30 nm. The tunneling insulating layer may be formed as a single insulating layer made of various materials such as silicon dioxide ($SiO_2$) or aluminum oxide ($Al_2O_3$). Alternatively, the tunneling insulating layer may be constructed with two or more insulating layers of which dielectric constants or band gaps are different.

The control electrode 140 having a thickness of 1 nm to 900 nm may be constructed with a single layer or multi-layers made of materials of which work functions are different. The control electrode may be made of highly doped p-type or n-type silicon (Si), poly-silicon (poly-Si), germanium (Ge), poly-germanium (poly-Ge), silicon-germanium (SiGe), poly-silicon-germanium (poly-SiGe), amorphous silicon (amorphous Si), amorphous germanium (amorphous Ge), amorphous silicon-germanium (amorphous SiGe), and the like. Alternatively, the control electrode may be made of a metal nitride such as tungsten nitride (WN), tantalum nitride (TaN), and titanium nitride (TiN). Selectively, the control electrode may be made of metals (for example, tungsten (W), etc) having various work functions. Selectively, the control electrode may be made of various silicides (for example, nickel monosilicide (NiSi), etc). The control electrode may be made of two or more conductive materials.

Hereinafter, a structure and operations of a NAND flash memory cell string according to another embodiment of the present invention will be described in detail.

In FIG. 5, (*a*) and (*b*) are cross-sectional views illustrating a flash memory cell string 50 according to another embodiment of the present invention. In FIG. 5, for the convenience of description, in order to represent main parts of the cell string according to the embodiment, the other parts including an insulation layer, a contact layer, and a metal wiring layer are not shown. Description that is the same as the description on the cell string according to the aforementioned embodiment will be omitted.

Referring to (*a*) of FIG. 5, the memory cell string 50 according to the embodiment includes a plurality of cell devices 51 to 54 and first and second switching devices 55 and 56 connected to both ends of the cell devices 51 to 54.

Figure 6B:
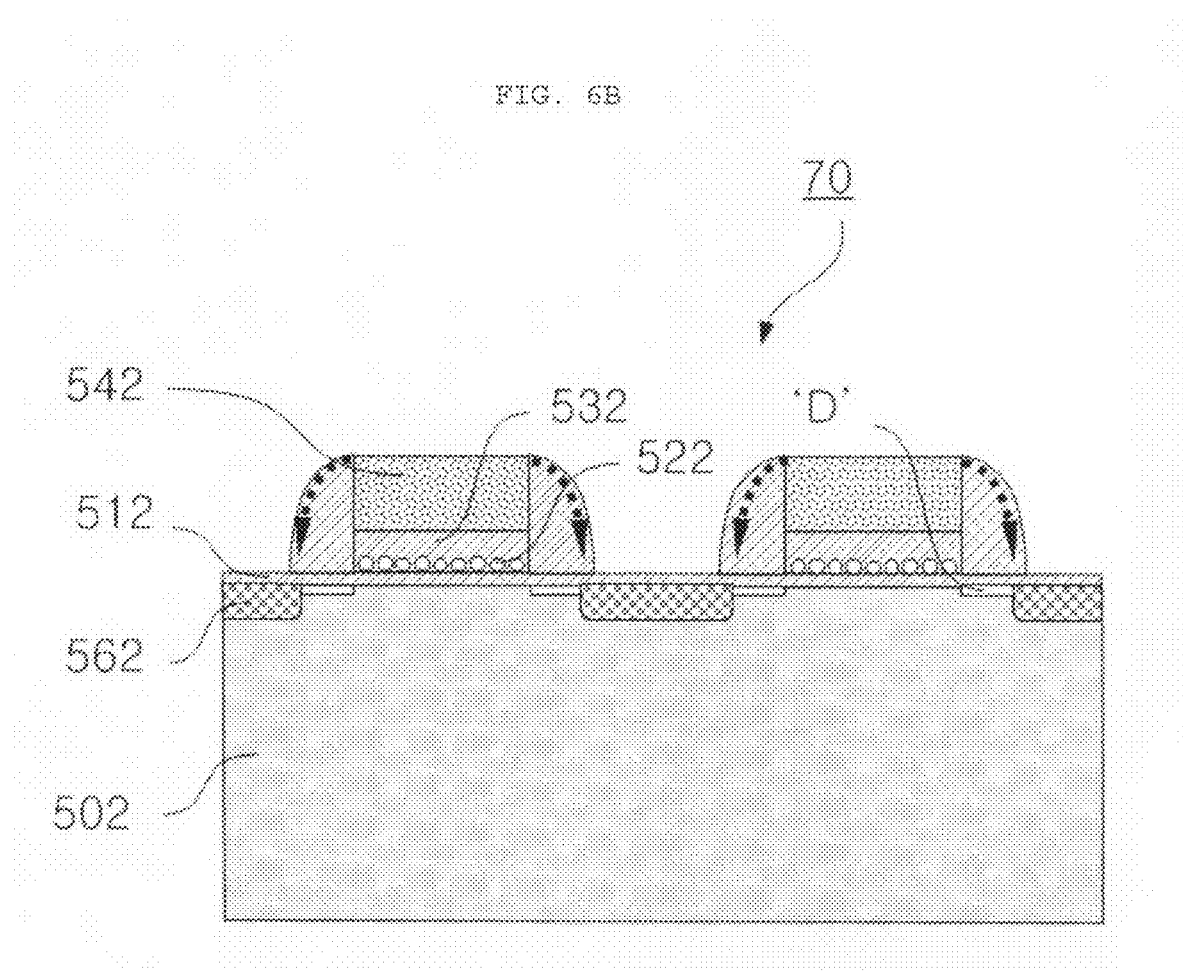
FIG. 6 includes cross-sectional views illustrating two of the cell devices of the flash memory cell string of (a) of FIG. 5.

In FIG. 6, (*a*) is an enlarged cross-sectional view illustrating cell devices 51 and 52 shown in (*a*) of FIG. 5. Referring to (*a*) of FIG. 6, a cell device 51 of the cell string according to the embodiment includes a semiconductor substrate 500, a tunneling insulating layer 510, a charge storage node 520, a control insulating layer 530, a control electrode 540, and a source/drain region 560. The source/drain region 560 does not overlap the control electrode 540. In the cell device 51 according to the embodiment, although a miniaturization property of a cell device deteriorates in comparison with a cell device according to the aforementioned embodiment, in a case where a current flows in a cell string, it is possible to reduce resistance due to a source or drain region.

The switching devices 55 and 56 are used to select a cell string and disposed at both ends of the cell devices.

As shown (*a*) or (*b*) of FIG. 5, the switching devices 55 and 56 are embodied as two structures. As shown in (*a*) of FIG. 5, in the switching devices of the flash memory cell string according to the embodiment, the source/drain 570 disposed in a side (A or B region shown in (*a*) of FIG. 5) that is not connected to a cell device does not overlap the control electrode. In a side connected to a cell device, the source or drain region does not overlap the control electrode.

On the other hand, as shown in (*b*) of FIG. 5, in the switching device of the flash memory cell string according to the embodiment, the source/drain disposed in a side that is not connected to a cell device overlap the control electrode. In a side connected to a cell device, the source or drain region does not overlap the control electrode.

Hereinafter, the structure of a cell device of the flash memory cell string according to the embodiment will be described with reference to FIG. 6.

Referring to (*a*) of FIG. 6, the cell device 51 is obtained by forming a semiconductor substrate 500, forming a tunneling insulating layer 510 on the semiconductor substrate 500, sequentially forming a charge storage node 520, a control insulating layer 530, and a control electrode 540 on the tunneling insulating layer 510, and forming a insulating layer spacer 550 on sides of the control electrode 540. The source/drain region 560 does not overlap the control electrode on a substrate that does not cross the control electrode. A second insulating layer having a predetermined thickness is formed on the resulting product. The cell device according to the embodiment can be applied to a NAND flash memory cell device.

The structure of the cell string will be described later.

In the structure of the cell device, the control electrode is formed, and the source or drain of the switching device in the side that is not connected to a cell device does not overlap the control electrode of the switching device. In the switching device for selecting a string, it is possible to reduce contact resistance by adding a highly doped source or drain region to the source or drain region.

In the cell device or the switching device for selecting a cell string, a spacing between the source/drain area and the control electrode is in a range of 0.1 nm to 100 nm. A depth of a source/drain junction is in a range of 2 nm to 100 nm from the surface of the semiconductor substrate. In the cell string, the length of the control electrode may be similar to or different from a spacing between adjacent control electrodes.

In FIG. 5, (*b*) is a cross-sectional view illustrating a cell string according to the embodiment. In switching devices 65 and 66 of the cell string 60, a source or drain region in a side (A and B regions shown (*b*) of FIG. 5) that is not connected to cell devices overlaps a control electrode.

In FIG. 6, (*a*) is a cross-sectional view illustrating two cell devices in the cell string shown in (*a*) of FIG. 5. In (*a*) of FIG. 6, a fringing electric field is represented by a dotted line arrow. A charge storage node of a cell device shown in (*a*) of FIG. 6 is constructed with a nitride layer. In FIG. 6, (*b*) is a cross-sectional view illustrating a cell string according to another embodiment of the present invention. In the cell string according to the embodiment, a charge storage node of a cell device is constructed with nano-sized dots or nano-sized crystals.

Figure 7:
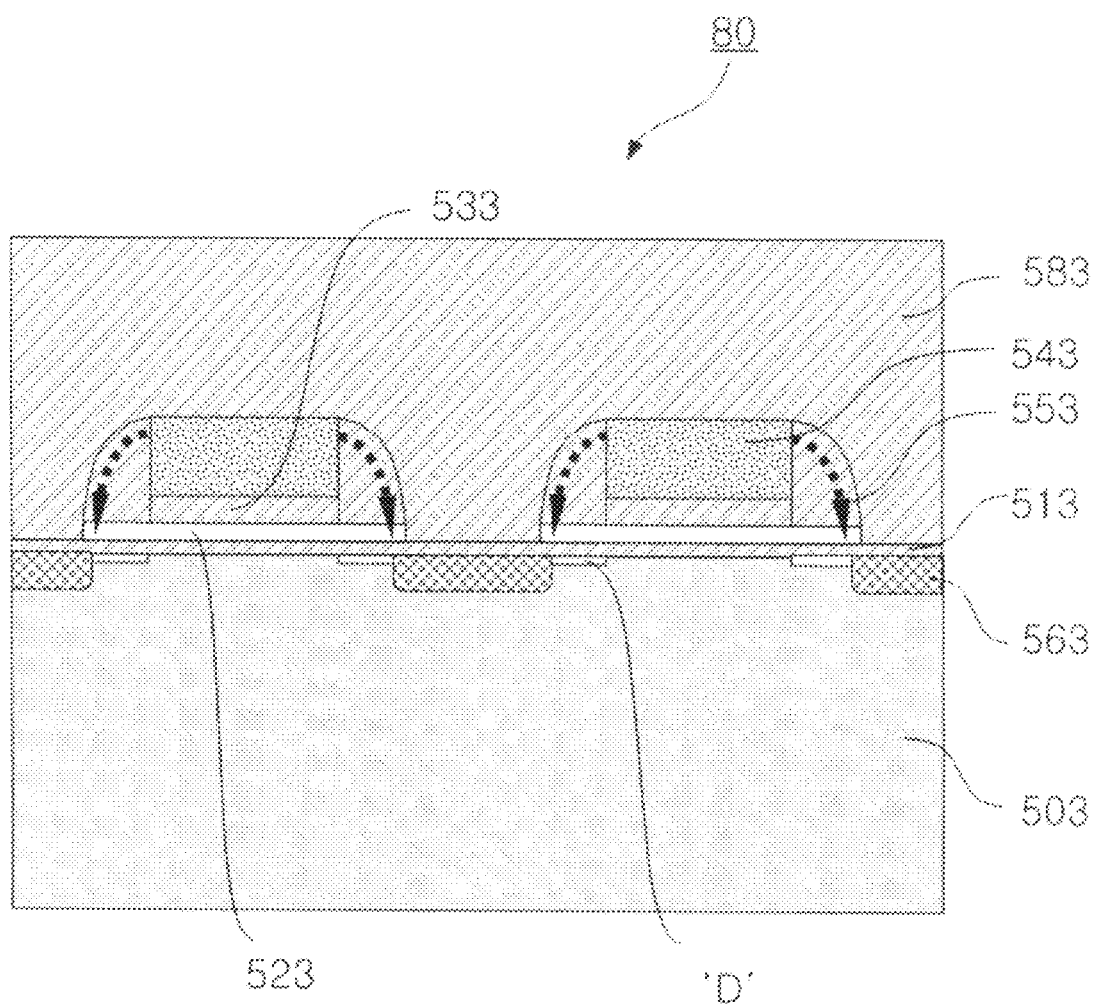
FIG. 7 is a cross-sectional view illustrating cell devices of a flash memory cell according to another embodiment of the present invention.

FIG. 7 is a cross-sectional view illustrating cell devices of a cell string according to another embodiment of the present invention. In a cell device 80 of the cell string according to the embodiment, a charge storage node 523 is longer than a control electrode 543. In a cell device of a cell string according to another embodiment, the length of the charge storage node is shorter than the length of the control electrode by etching sides of the charge storage node.

One or more switching devices for selecting a cell string in the cell string may be formed at both ends of the cell devices. A source/drain formed at a switching device for selecting a cell string may be additionally doped in high concentration.

In the flash memory cell string according to the present invention, it is possible to reduce a short channel effect by increasing doping concentration in a channel. That is, only a channel is selectively doped by opening a region where a control electrode is to be formed. A tunneling insulating layer, a charge storage node, and a control insulating layer are sequentially formed on the opened region. It is possible to form a control electrode by filling the region in a damascene shape. In this case, the inversion layer caused by the fringing electric field generated from sides of the control electrode is easily induced, and the short channel effect of a device can be suppressed. Further, a region of the substrate under the control electrode, i.e., a region to be a channel formed by the fringing electric field, may be more highly doped than a region of the substrate between the cell devices to thereby suppress a short channel effect during operation of the flash memory cell.

Hereinafter, a procedure of fabricating a flash memory cell string according to an exemplary embodiment of the present invention will be described with reference to FIG. 8.

First, a device isolation film for isolating a device on a semiconductor substrate is formed (Step 800). A chemical cleansing or thermal treating process for improving properties of a surface of a substrate on which a device is formed is performed, and a tunneling insulating layer is formed (Step 810). A charge storage node and a control insulating layer are formed (Step 820). A control electrode is formed by depositing a material to be formed as the control electrode and patterning the material using a photolithography process (Step 830). A spacer is formed by removing the control insulating layer through an etching process and removing an exposed charge storage node through an etching process, or by depositing an insulation material and forming a spacer through an anisotropic etching process (Step 840). The charge storage node is removed through an etching process, a source/drain is formed in a region excluding cell devices, and resistance is reduced by doping the source/drain in high concentration in a portion where contacts are to be formed in a region excluding the cell devices. An insulation layer is formed, a contact is formed in a portion where the contact is needed in a region excluding the cell device, and metal wires are formed (Step 860).

In a case where a source/drain region does not overlap a control electrode in a cell device in the procedure of fabricating the cell devices, a control electrode is formed, insulation spacers are formed, and a source/drain region is formed through an ion injection process or plasma ion injection process. In a source/drain where contacts are to be formed, resistance is reduced by doping the source/drain region in high concentration after masking the cell devices.

INDUSTRIAL APPLICABILITY

A highly integrated flash memory cell string, a cell device, and a method of fabricating the same will be widely applicable for semiconductor memory devices.

The invention claimed is:

1. A flash memory cell string constructed with sequentially connected cell devices and at least one switching device for selecting the cell string which is located at an end of the connected cell devices,
    wherein each of the cell devices includes a semiconductor substrate and a tunneling insulating layer formed on the semiconductor substrate, and a charge storage node, a control insulating layer and a first control electrode which are formed in the described order on the tunneling insulating layer,
    wherein the cell devices do not include source and drain regions, and
    wherein a first region of the substrate directly under the first control electrode is doped more highly than a second region which extends from the upper surface of the substrate between the cell devices, wherein the first and second regions are both doped regions, so that, during operation of the cell device, an inversion layer is easily induced by a fringing electric field generated by sides of the control electrode and then effectively suppress a short channel effect.

2. The flash memory cell string according to claim 1,
    wherein the switching device includes the semiconductor substrate, a gate insulating layer formed on the semiconductor substrate, and a second control electrode formed on the gate insulating layer, and a source or drain region formed on the semiconductor substrate,
    wherein the switching device does not include a source or drain region in a side connected to an adjacent cell device and includes a source or drain region in a side that is not connected to any cell device,
    wherein the source or drain region does not overlap the second control electrode of the switching device.

3. The flash memory cell string according to claim 1,
    wherein the switching device includes the semiconductor substrate, a gate insulating layer formed on the semiconductor substrate, and a second control electrode formed on the gate insulating layer, and a source or drain region formed on the semiconductor substrate,
    wherein the switching device does not include a source or drain region in a side connected to an adjacent cell device and includes a source or drain region in a side that is not connected to any cell device.

4. The flash memory cell string according to claim 2,
    wherein insulating spacers are formed on side walls of the first and second control electrodes of the switching device and the cell devices, or wherein insulating spacers are formed on the side walls of the first and second control electrodes of the switching device and the cell devices and an insulating layer having a large dielectric constant is formed between adjacent insulating spacers.

5. The flash memory cell string according to claim 2, wherein the gate insulating layer formed under the second control electrode of the switching device is constructed with a tunneling insulating layer, a charge storage node, and a control insulating layer or constructed with one or more insulating layers.

6. The flash memory cell string according to claim 1, wherein the tunneling insulating layer is constructed with a plurality of insulating layers, and each layer of the tunneling insulating layer is made of material having dielectric constant and band gap which are different from those of material of other layers of the tunneling insulating layer.

7. The flash memory cell string according to claim 1, wherein the charge storage node is constructed with a thin film made of an insulation material, constructed with nano-sized dots or nano-sized crystal, or constructed by combining the thin film with the nano-sized dots.

8. The flash memory cell string according to claim 7, wherein when the charge storage node is constructed with the thin film, the thin film includes a nitride layer or a metal oxide,
wherein when the charge storage node is constructed with the nano-sized dots, the dots is made of one or more materials selected from the group consisting of a semiconductor material, a metal oxide, a metal, a metal nitride, and a silicide material, and
wherein when the charge storage node is constructed by combining the thin film with the nano-sized dots, the charge storage node is constructed with the insulating thin film and nano-sized conductive or insulating dots.

9. The flash memory cell string according to claim 1, wherein the first control electrode is constructed with a plurality of layers, and layer of the first control electrode is made of material having work function or conductivity which is different from those of material of other layers of the first control electrode.

10. The flash memory cell string according to claim 1, wherein the first control electrode is made of a material selected form the group consisting of highly doped p-type or n-type silicon (Si), poly-silicon (poly-Si), germanium (Ge), poly-germanium (poly-Ge), silicon-germanium (SiGe), poly-silicon-germanium (poly-SiGe), amorphous silicon (amorphous Si), amorphous germanium (amorphous Ge), amorphous silicon-germanium (amorphous SiGe), a metal nitride, a metal, and a silicide.

\* \* \* \* \*